United States Patent
Tan et al.

(10) Patent No.: US 9,178,138 B2
(45) Date of Patent: Nov. 3, 2015

(54) METHOD FOR FORMING A PCRAM WITH LOW RESET CURRENT

(71) Applicant: GLOBALFOUNDRIES Singapore Pte. Ltd., Singapore (SG)

(72) Inventors: Shyue Seng Tan, Singapore (SG); Eng Huat Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/324,703

(22) Filed: Jul. 7, 2014

(65) Prior Publication Data

US 2014/0319448 A1 Oct. 30, 2014

Related U.S. Application Data

(62) Division of application No. 13/562,641, filed on Jul. 31, 2012, now Pat. No. 8,803,122.

(51) Int. Cl.
*H01L 29/78* (2006.01)
*H01L 45/00* (2006.01)
*H01L 21/8239* (2006.01)

(52) U.S. Cl.
CPC .............. *H01L 45/06* (2013.01); *H01L 45/122* (2013.01); *H01L 45/124* (2013.01); *H01L 45/126* (2013.01); *H01L 45/1226* (2013.01); *H01L 45/144* (2013.01); *H01L 45/1691* (2013.01)

(58) Field of Classification Search
CPC ... H01L 45/06; H01L 45/1226; H01L 45/124; H01L 45/122; H01L 2924/00; H01L 27/11521; H01L 27/11568; H01L 29/792; H01L 27/115

USPC .................................................. 257/2, 3, 4, 5
See application file for complete search history.

(56) References Cited

U.S. PATENT DOCUMENTS

| | | | |
|---|---|---|---|
| 2002/0036931 A1* | 3/2002 | Lowrey et al. ................. | 365/200 |
| 2004/0262638 A1* | 12/2004 | Mazoyer et al. ............... | 257/201 |
| 2007/0194294 A1* | 8/2007 | Song et al. ......................... | 257/5 |
| 2008/0179665 A1* | 7/2008 | Lee et al. ....................... | 257/330 |
| 2008/0210924 A1* | 9/2008 | Shin ................................ | 257/4 |
| 2009/0050869 A1* | 2/2009 | Kim et al. ......................... | 257/2 |
| 2009/0050872 A1* | 2/2009 | Kuo et al. ......................... | 257/3 |

(Continued)

OTHER PUBLICATIONS

R. Bez, "Chalcogenide PCM: a Memory Technology for Next Decade," Conference Publication, Electron Devices Meeting (IEDM), IEEE International, 2009, pp. 5.1.1-51.4.

(Continued)

*Primary Examiner* — Vongsavanh Sengdara
*Assistant Examiner* — Thai T Vuong
(74) *Attorney, Agent, or Firm* — Ditthavong & Steiner, P.C.

(57) ABSTRACT

Phase-change memory structures are formed with ultra-thin heater liners and ultra-thin phase-change layers, thereby increasing heating capacities and lowering reset currents. Embodiments include forming a first interlayer dielectric (ILD) over a bottom electrode, removing a portion of the first ILD, forming a cell area, forming a u-shaped heater liner within the cell area, forming an interlayer dielectric structure within the u-shaped heater liner, the interlayer dielectric structure including a protruding portion extending above a top surface of the first ILD, forming a phase-change layer on side surfaces of the protruding portion and/or on the first ILD surrounding the protruding portion, and forming a dielectric spacer surrounding the protruding portion.

20 Claims, 21 Drawing Sheets

(56) References Cited

U.S. PATENT DOCUMENTS

| | | | |
|---|---|---|---|
| 2010/0072446 A1* | 3/2010 | Kim et al. | 257/2 |
| 2010/0072453 A1* | 3/2010 | Jeong et al. | 257/5 |
| 2011/0212568 A1* | 9/2011 | Shin | 438/102 |
| 2011/0242885 A1* | 10/2011 | Kim | 365/163 |
| 2011/0309319 A1* | 12/2011 | Quick et al. | 257/4 |
| 2012/0108031 A1* | 5/2012 | Lee et al. | 438/382 |

OTHER PUBLICATIONS

S.L. Cho et al. "Highly Scalable On-axis Confined Cell Structure for High Density PRAM beyond 256Mb" Conference Publication, Symposium on VLSI Technology Digest of Technical Papers, 2005, pp. 96-97.

A. Pirovano et al. "Scaling Analysis of Phase-Change Memory Technology", Conference Publication, Electron Devices Meeting (IEDM), IEEE International, 2003, pp. 1-4.

Y. Sasago et al. "Cross-Point Phase Change Memory with 4F2 Cell Size Driven by Low-Contact-Resistivity Poly-Si Diode", Conference Publication, Symposium on VLSI Technology Digest of Technical Papers (2009), pp. 24-25.

Y Zhang et al. "An Integrated Phase Change Memory Cell with Ge Nanowire Diode for Cross-Point Memory", Conference Publication, Symposium on VLSI Technology Digest of Technical Papers (2007), pp. 98-99.

* cited by examiner

METHOD FOR FORMING A PCRAM WITH LOW RESET CURRENT

CROSS REFERENCED APPLICATION

This application is a Divisional of U.S. application Ser. No. 13/562,641 filed Jul. 31, 2012, entirety of which is incorporated herein by reference.

TECHNICAL FIELD

The present disclosure relates to phase-change memory structures (PCRAMs) for non-volatile memory (NVM) devices. The present disclosure is particularly applicable to a PCRAM with a high heating capacity at a low reset current.

BACKGROUND

PCRAM structures have received increased attention because of their simplicity and scalability as compared with floating-gate (FG) and nitride-based NVM devices. However, PCRAM structures face several challenges. For example, a high current is required to generate the heat quickly and at a high magnitude to promote the fast phase-change (resistance change) of the phase-change material.

A need therefore exists for methodology enabling PCRAM structures with higher heating capacities at lower reset currents, and the resulting structures.

SUMMARY

An aspect of the present disclosure is an efficient method for fabricating a PCRAM structure with a low reset current and a high heating capacity having an ultra-thin heater liner, an ultra-thin phase-change layer, and a small contact area between the heater liner and the phase-change layer.

Another aspect of the present disclosure is a PCRAM structure with a low reset current and a high heating capacity having an ultra-thin heater liner, an ultra-thin phase-change layer, and a small contact area between the heater liner and the phase-change layer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first interlayer dielectric (ILD) over a bottom electrode, removing a portion of the first ILD, forming a cell area, forming a u-shaped heater liner within the cell area, forming an interlayer dielectric structure within the u-shaped heater liner, the interlayer dielectric structure including a protruding portion extending above a top surface of the first ILD, forming a phase-change layer on side surfaces of the protruding portion and/or on the first ILD surrounding the protruding portion, and forming a dielectric spacer surrounding the protruding portion.

Aspects of the present disclosure include forming the phase-change layer on the first ILD, and removing a portion of the phase-change layer vertically contiguous with the portion of the first ILD, prior to forming the u-shaped heater liner. Another aspect includes forming the u-shaped heater liner within the cell area and between the phase-change layer and the protruding portion with a top surface of the u-shaped heater liner being coplanar with a top surface of the phase-change layer. Further aspects include forming the phase-change layer on the first ILD, forming the dielectric spacer on the phase-change layer, and removing a portion of the phase-change layer from the first ILD not under the dielectric spacer. Additional aspects include forming a second ILD over the phase-change layer, and forming the protruding portion to a height that is coplanar with a top surface of the second ILD. Other aspects include forming a second ILD over the first ILD prior to forming the phase-change layer, removing a portion of the second ILD vertically contiguous with the portion of the first ILD, prior to forming the u-shaped heater liner. Further aspects include forming the phase-change layer on side surfaces of the protruding portion, and forming the dielectric spacer surrounding the phase-change layer. Additional aspects include forming the phase-change layer on side surfaces of the protruding portion and on the first ILD, and forming the dielectric spacer above the phase-change layer on the first ILD and surrounding the phase-change layer on the side surfaces of the protruding portion. A further aspect includes forming a top electrode over the first ILD, the dielectric spacer, and the protruding portion.

Another aspect of the present disclosure is a device including: a bottom electrode, a u-shaped heater liner, an ILD on the bottom electrode, surrounding the u-shaped heater liner, an interlayer dielectric structure surrounded by the u-shaped heater liner and including a protrusion extending above the u-shaped heater liner and a top surface of the ILD, a phase-change layer on the ILD and surrounding the interlayer dielectric structure and/or on side surfaces of the protrusion, a dielectric spacer above the ILD and surrounding the protrusion, and a top electrode covering the ILD, the protrusion, and the dielectric spacer.

Aspects include a device including the phase-change layer being on the ILD under the dielectric spacer. Further aspects include a top surface of the phase-change layer being level with a top surface of an exposed portion of the u-shaped heater liner above the ILD, and the phase-change layer surrounding the exposed portion of the u-shaped heater liner. Another aspect includes the phase-change layer being on side surfaces of the protrusion, between the dielectric spacer and the protrusion. A further aspect includes the phase-change layer being contiguous and aligned with vertical portions of the u-shaped heater liner. Yet another aspect includes a height of the phase-change layer and a height of the protrusion being substantially the same. A further aspect includes the top surface of the phase-change layer extending above a top surface of the dielectric spacer. Another aspect includes a thickness of a heater liner layer forming the u-shaped heater liner being the same as a thickness of the phase-change layer. Additional aspects include a first portion of the phase-change layer being on the ILD under the dielectric spacer, and a second portion of the phase-change layer being on side surfaces of the protrusion between the dielectric spacer and the protrusion. An additional aspect includes the first portion of the phase-change layer being contiguous and aligned with vertical portions of the u-shaped heater liner.

Another aspect of the present disclosure includes: forming a first ILD over a bottom electrode, forming a second ILD on the first ILD, removing a portion of the first and second ILDs, forming a cavity, conformally depositing a heater liner over the second ILD and within the cavity, planarizing the heater liner down to the second ILD, filling the cavity with an interlayer dielectric material, removing a portion of the heater liner adjacent the second ILD and the second ILD, leaving a portion of the interlayer dielectric material protruding from the cavity, forming a phase-change layer on side surfaces of the protruding portion and/or on the first ILD surrounding the protruding portion, forming a dielectric spacer surrounding the protruding portion, and forming a top electrode over the first ILD, the dielectric spacer, and the protruding portion.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of high current requirements to generate heat in a short amount of time and at a high magnitude attendant upon promoting a fast phase-change in a phase-change layer in a PCRAM. In accordance with embodiments of the present disclosure, a PCRAM structure is produced with an ultra-thin heater liner, an ultra-thin phase-change layer, and a small contact area between the heater liner and the phase-change layer, resulting in a higher heating capacity at a lower reset current.

Methodology in accordance with embodiments of the present disclosure includes forming an ILD over a bottom electrode, removing a portion of the ILD, forming a cell area, and forming a u-shaped heater liner within the cell area followed by forming an interlayer dielectric structure within the u-shaped heater liner. The interlayer dielectric structure may include a protruding portion extending above a top surface of the ILD. A phase-change layer may then be formed on side surfaces of the protruding portion and/or on the ILD surrounding the protruding portion. Then, a dielectric spacer may be formed surrounding the protruding portion. After forming the dielectric spacer, a top electrode may be formed over the ILD, the dielectric spacer, and the protruding portion.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
FIGS. 1 through 11 schematically illustrate a method for forming a PCRAM structure with a low reset current, in accordance with an exemplary embodiment.

Adverting to FIG. 1, a method of forming a PCRAM with a low reset current, in accordance with an exemplary embodiment, begins with an electrode 101. The electrode 101 may be formed of aluminum (Al), platinum (Pt), titanium nitride (TiN), titanium nitride and titanium (TiN/Ti), ruthenium (Ru), nickel (Ni), or polysilicon.

Figure 2:
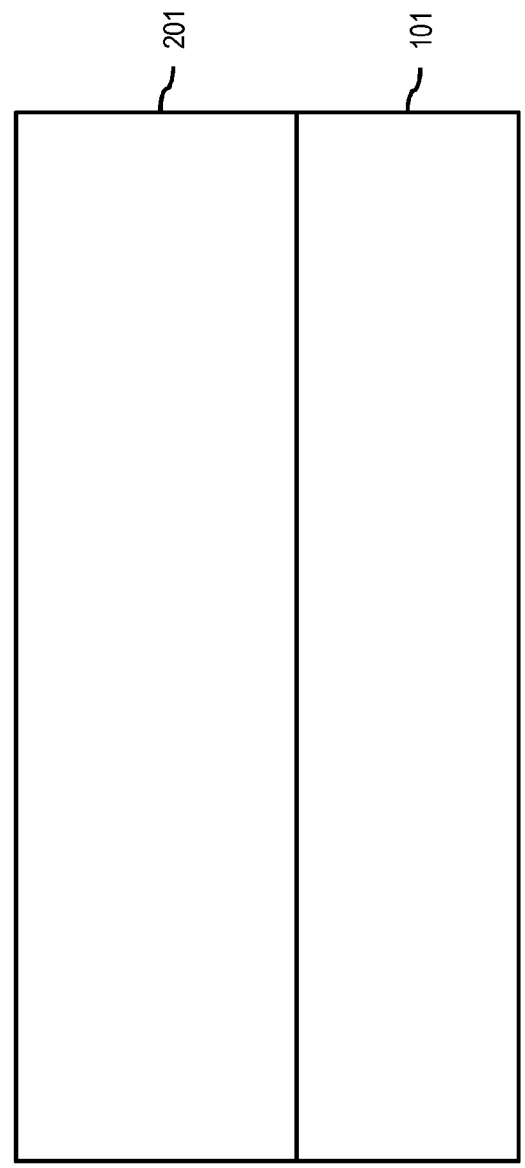

Next, a first ILD 201 may be formed over the electrode 101, as illustrated in FIG. 2. The first ILD 201 may be formed of a low thermal conductivity dielectric, such as silicon oxide ($SiO_2$), silicon oxynitride (SiON), silicon nitride ($Si_3N_4$), or fluorine doped $SiO_2$.

Figure 3:
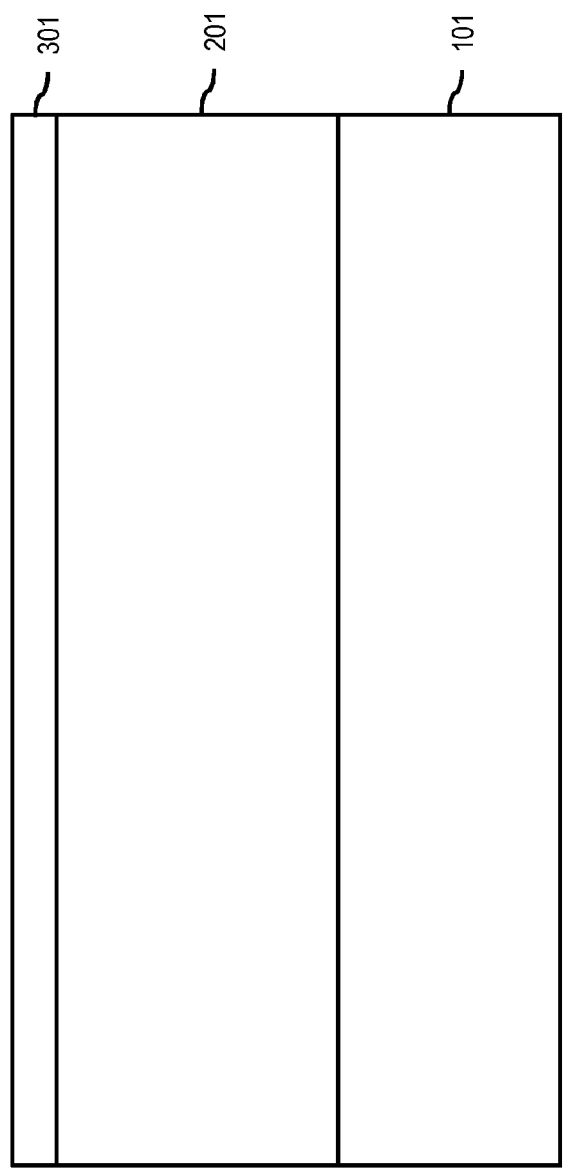

As illustrated in FIG. 3, a phase-change layer 301 may be formed over the first ILD 201. The phase-change layer 301 may be formed of any type of phase-change material, such as GST ($Ge_2Sb_2Te_5$) or AIST (silver and indium doped $Sb_2Te$). The phase-change layer 301 may be formed to a thickness of 10 to 50 angstroms (Å). Alternatively, the thickness of the phase-change layer 301 may be thinner than 10 Å.

Figure 4:
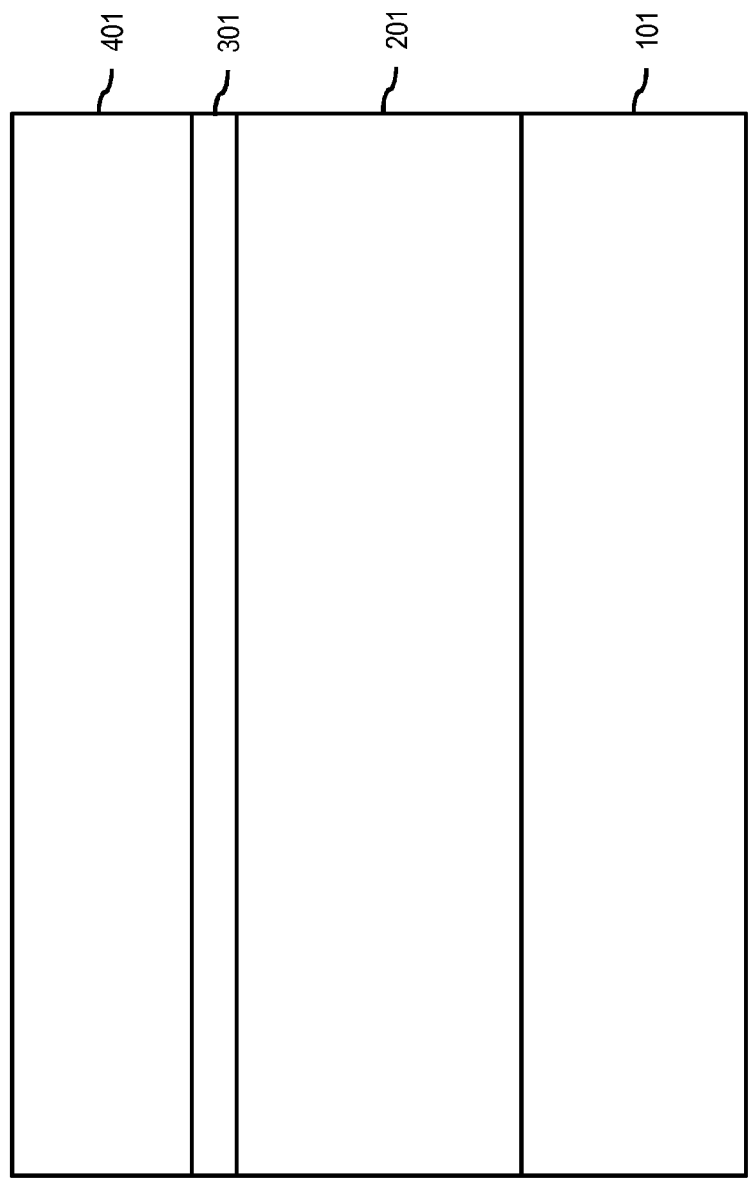

Subsequently, a second ILD 401 may be formed over the phase-change layer 301 (FIG. 4). The second ILD 401 may be formed of a material with a different etch selectivity than the material of the first ILD 201, such as any low thermal conductivity dielectric, including $SiO_2$, SiON, silicon nitride $Si_3N_4$, and fluorine doped $SiO_2$, that is different than the first ILD 201.

Figure 5:
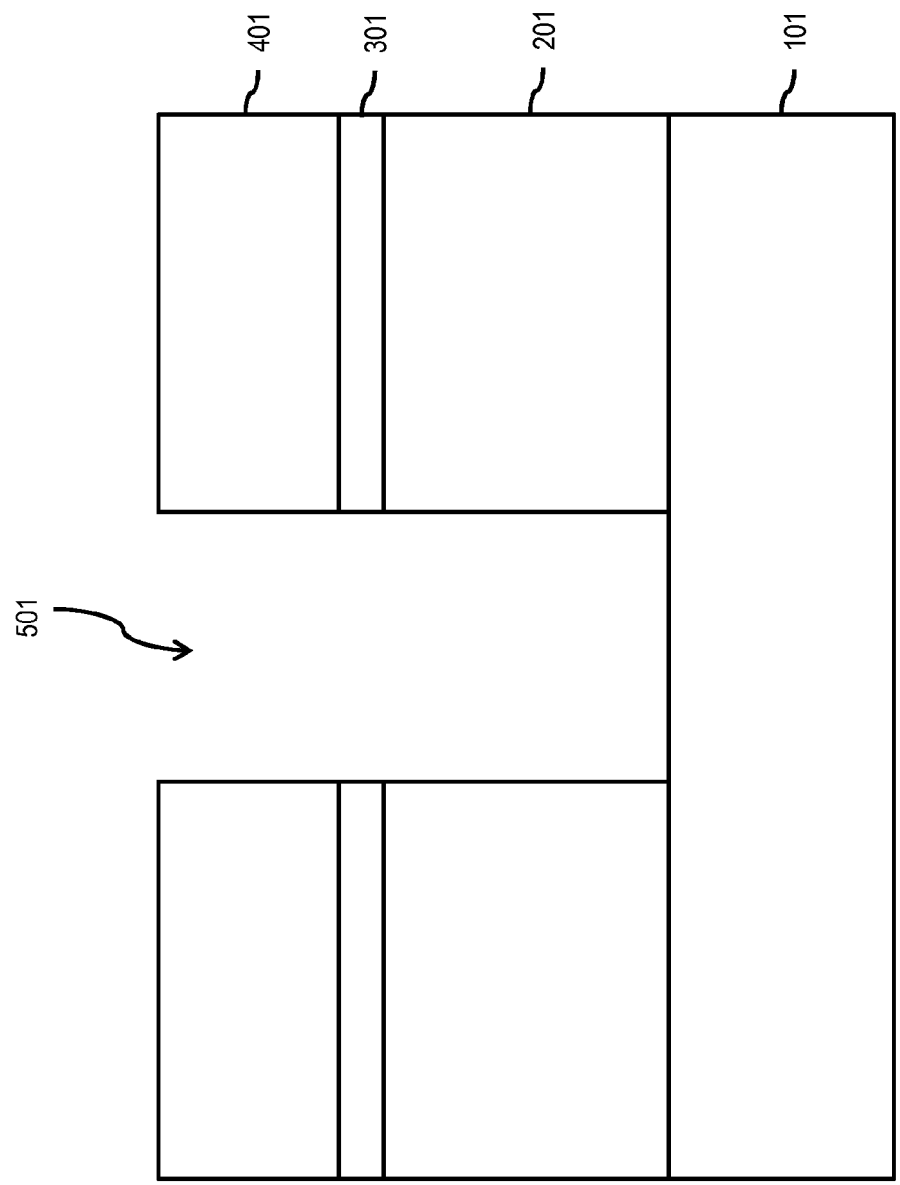

Next, a cell area 501 may be formed by removing portions of the second ILD 401, the phase-change layer 301, and the first ILD 201, as illustrated in FIG. 5. The cell area 501 may be formed according to any process, such as a contact-etch process with one or more steps, that is able to remove the three layers. The cell area 501 may be formed to a depth of 100 to 200 nanometers (nm) and a width of 30 to 60 nm.

Figure 6:
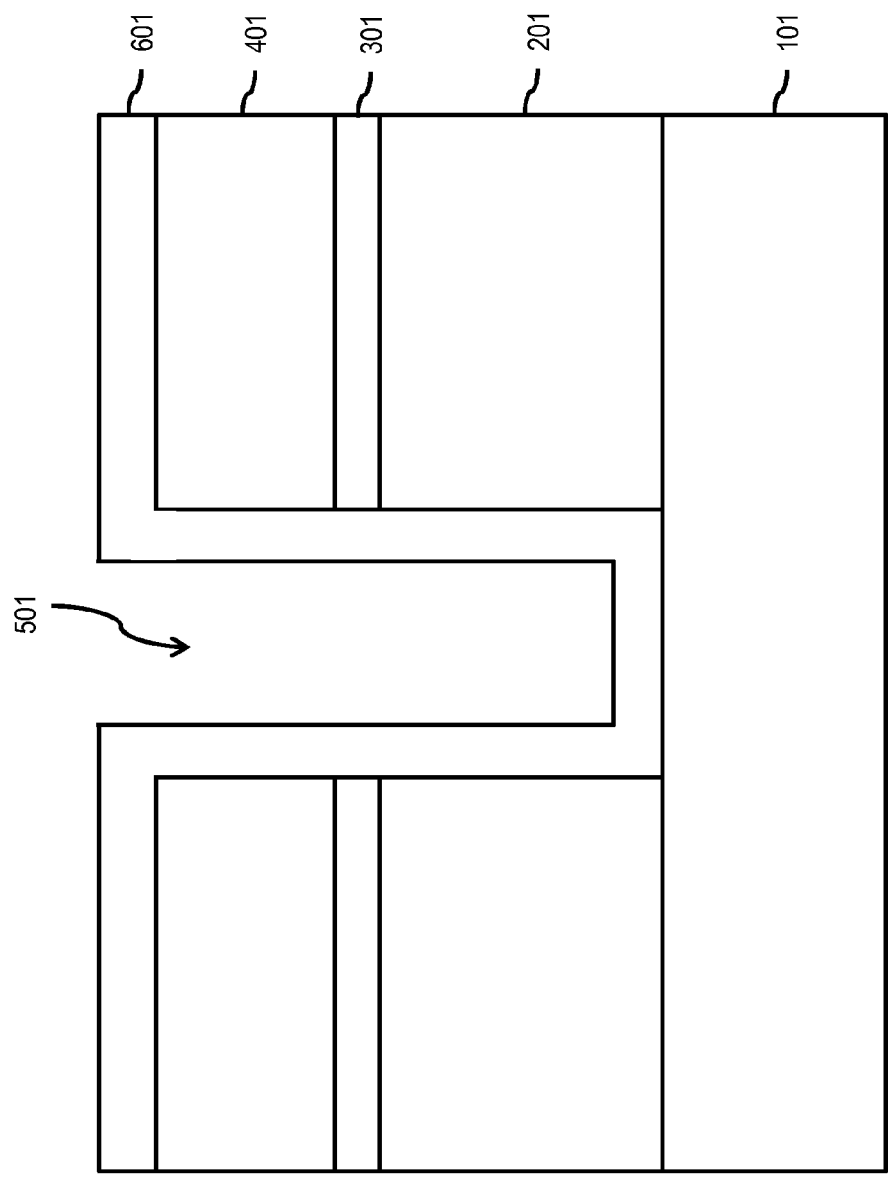

Adverting to FIG. 6, a heater liner 601 may be conformally deposited over the second ILD 401 and within the cell area 501. The heater liner 601 may be formed of tungsten (W), titanium (Ti), or TiN. The heater liner 601 may be formed to a thickness of 10 to 50 Å. However, the thickness of the heater liner 601 also may be thinner than 10 Å. The thickness of the heater liner 601 may be the same as, or different than, the thickness of the phase-change layer 301.

Figure 7:
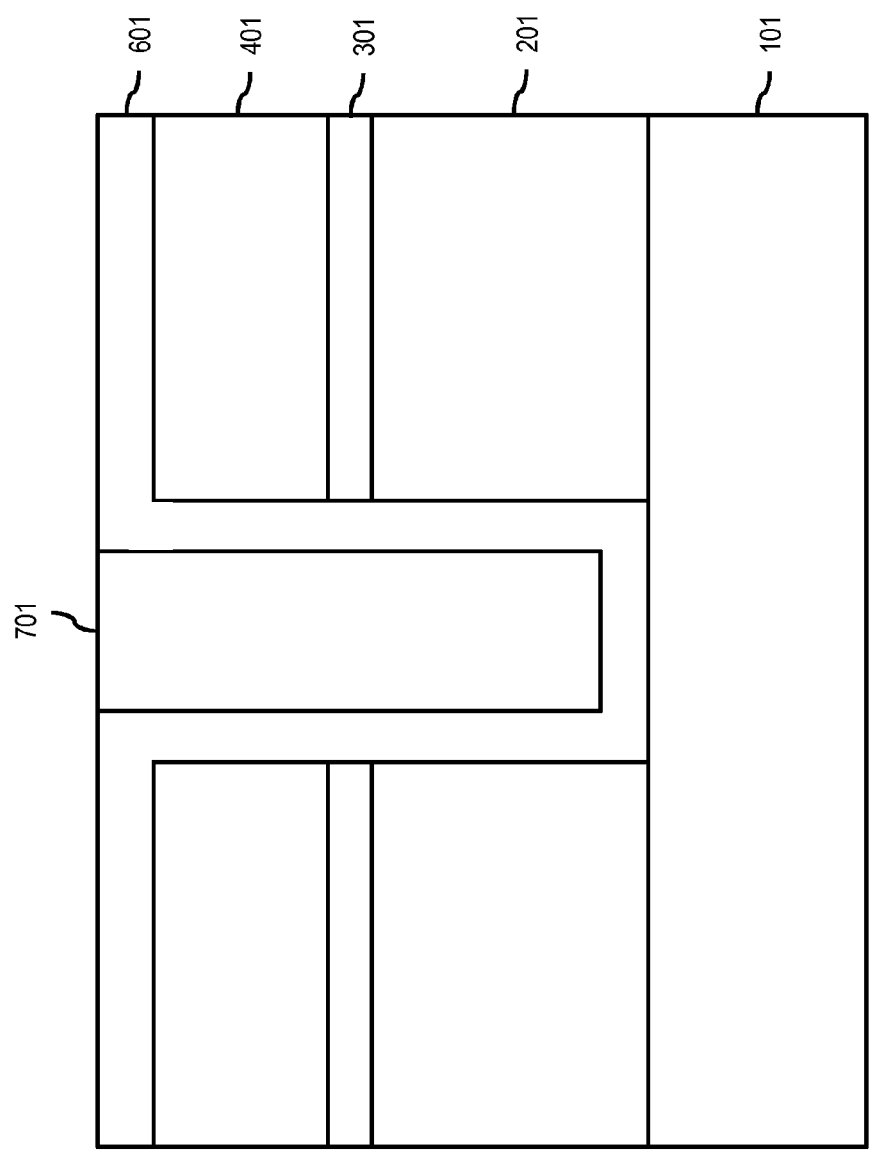

The remaining area of the cell area 501 may be subsequently filled with an interlayer dielectric material to form an interlayer dielectric structure 701 (FIG. 7). The interlayer dielectric material used to form the interlayer dielectric structure 701 may be any interlayer dielectric, such as $SiO_2$, SiON, $Si_3N_4$, and fluorine doped $SiO_2$, provided that the interlayer dielectric material employed differs from the dielectric material of the second ILD 401.

Figure 8:
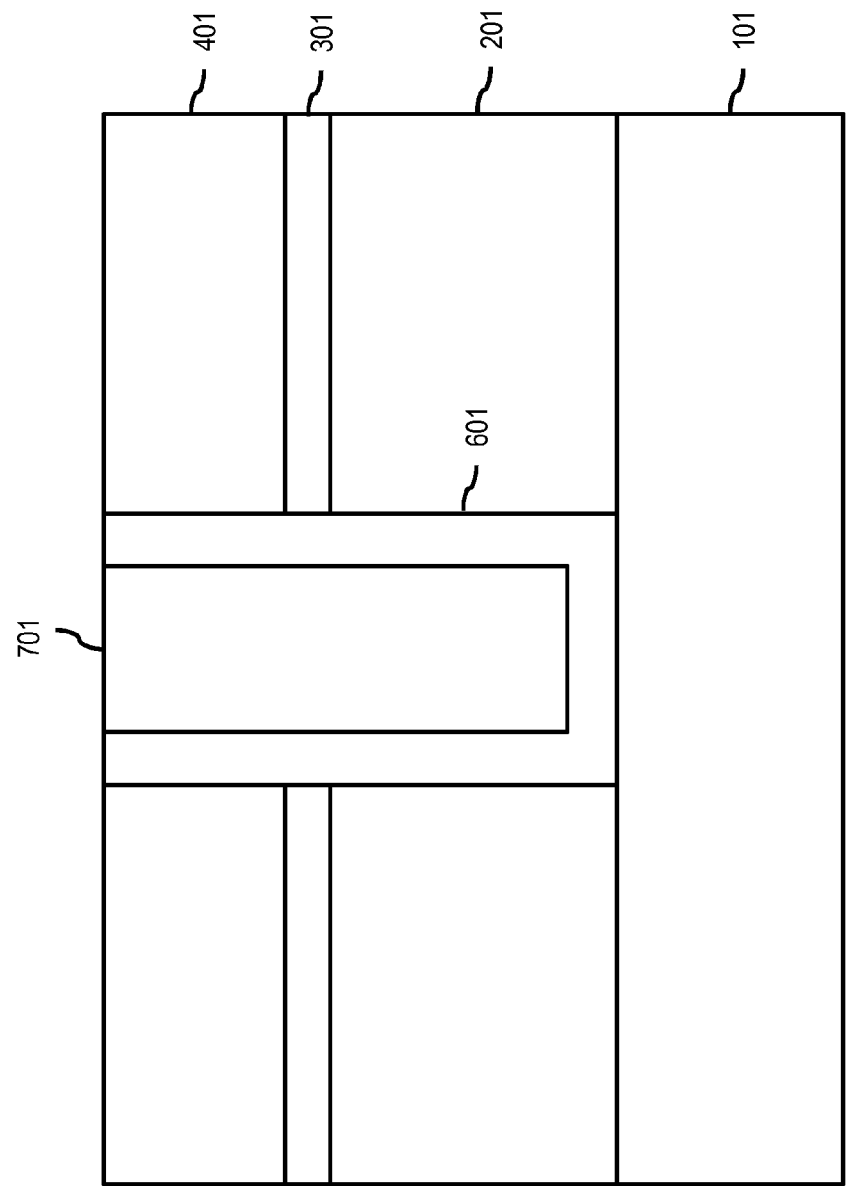

Subsequently, the portions of the heater liner 601 and the interlayer dielectric structure 701 above the top surface of the second ILD 401 may be removed, as illustrated in FIG. 8. The portions of the heater liner 601 and the interlayer dielectric structure 701 may be removed according to any known process, such as chemical mechanical polishing (CMP) down to the second ILD 401.

Figure 9:
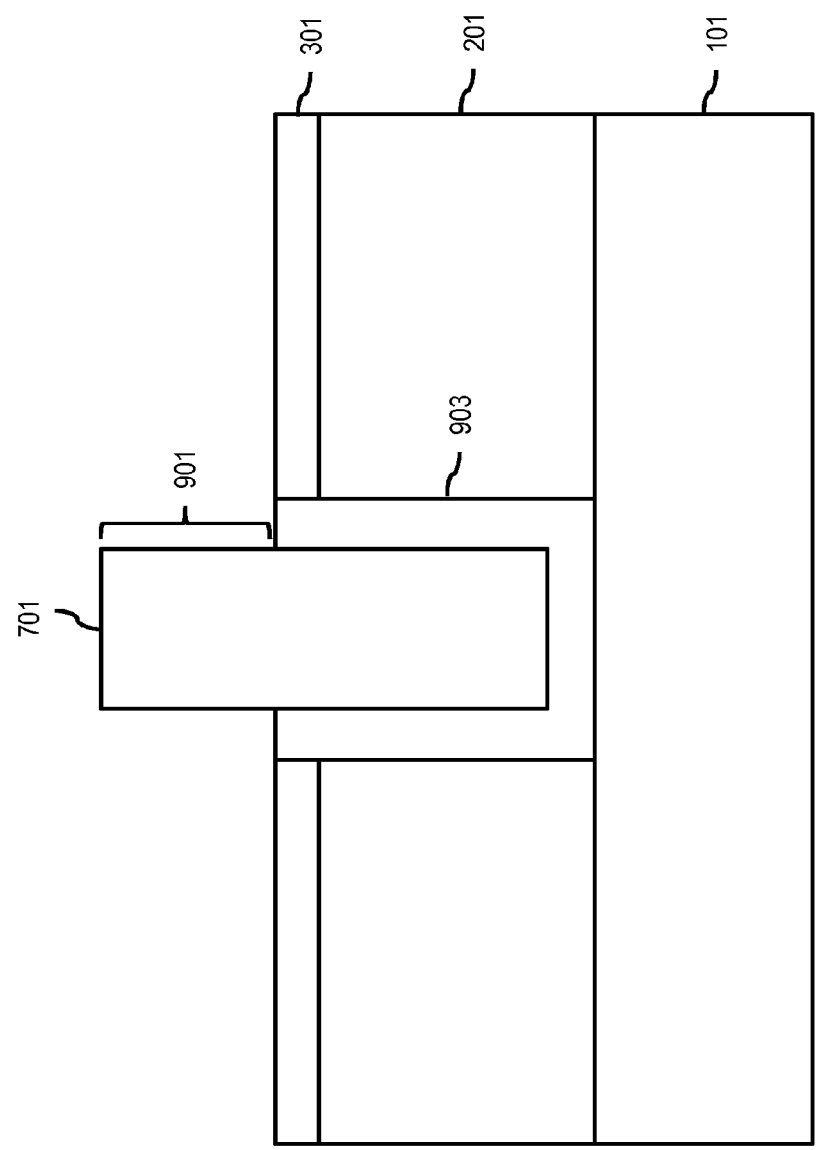

After the second ILD 401 is exposed, the second ILD 401 may be removed according to any process that is selective to the interlayer dielectric structure 701, such as a blanket etch process. Additionally, a portion of the heater liner 601 surrounding the interlayer dielectric structure 701 that is above the top surface of the phase change layer 301 is removed, exposing a protruding portion 901 of the interlayer dielectric structure 701, as illustrated in FIG. 9. The portion of the heater liner 601 may be removed according to any process, such as by the one used to remove the second ILD 401 or another etch process. The remaining portion of the heater liner 601 forms a u-shaped heater liner 903. As illustrated in FIG. 9, the top surface of the vertical portions of the u-shaped heater liner 903 may be coplanar with the top surface of the phase-change layer 301.

Figure 10:
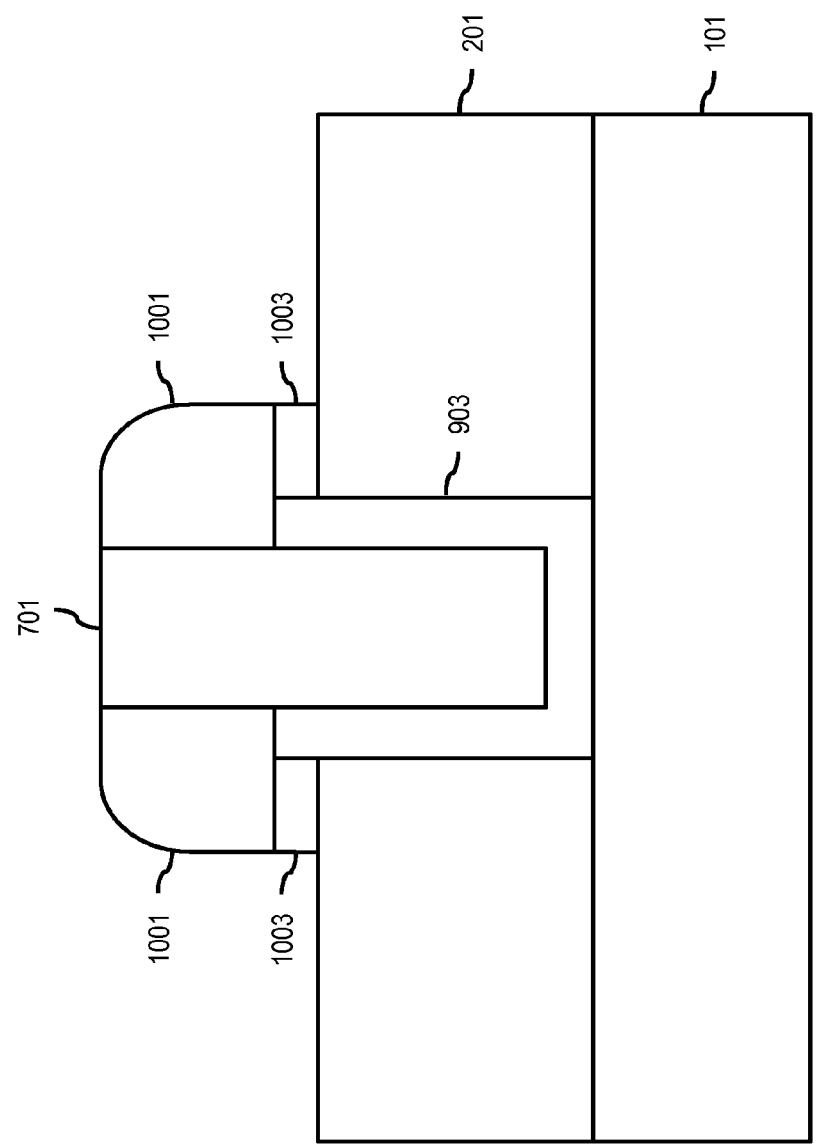

Adverting to FIG. 10, a dielectric spacer 1001 may be formed surrounding the protruding portion 901 of the interlayer dielectric structure 701. The dielectric spacer 1001 may be formed of a dielectric material, such as $SiO_2$, SiON, or $Si_3N_4$. Further, the portion of the phase-change layer 301 that is not covered by the dielectric spacer 1001 may be removed leaving a covered phase-change layer 1003 between the dielectric spacer 1001 and the first ILD 201 in a vertical direction, and on side surfaces of the exposed portion of the u-shaped heater liner 903 in a horizontal direction.

Figure 11:
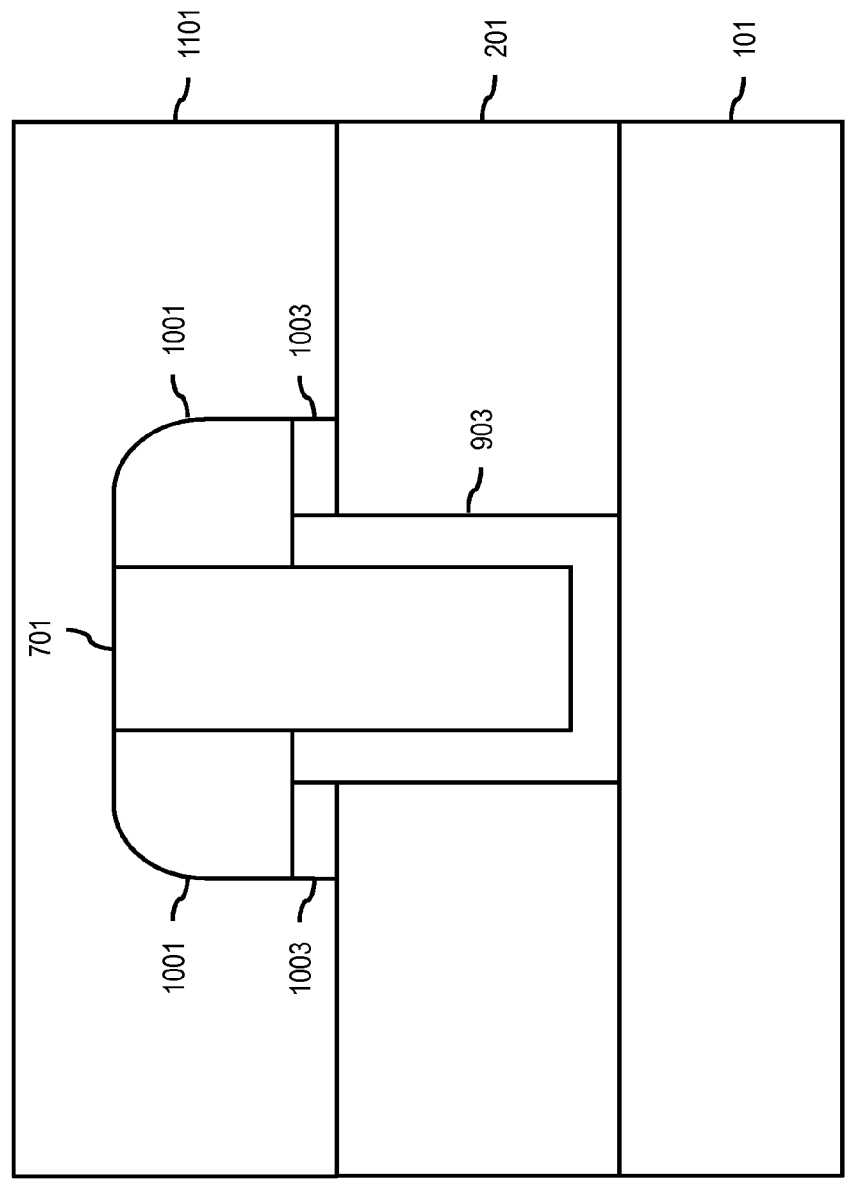

Subsequently, an electrode 1101 may be formed over the entire structure, including the first ILD 201, the dielectric spacer 1001, and the interlayer dielectric structure 701, as illustrated in FIG. 11. The electrode 1101 may be formed of Al, Pt, TiN, multilayer films of TiN/Ti, Ru, Ni, or polysilicon. The resulting structure is a PCRAM with a low reset current of 0.1 to 10 nanoamp $(nA)/nm^2$ with a heating capacity of 600 to 800° C.

Figure 12:
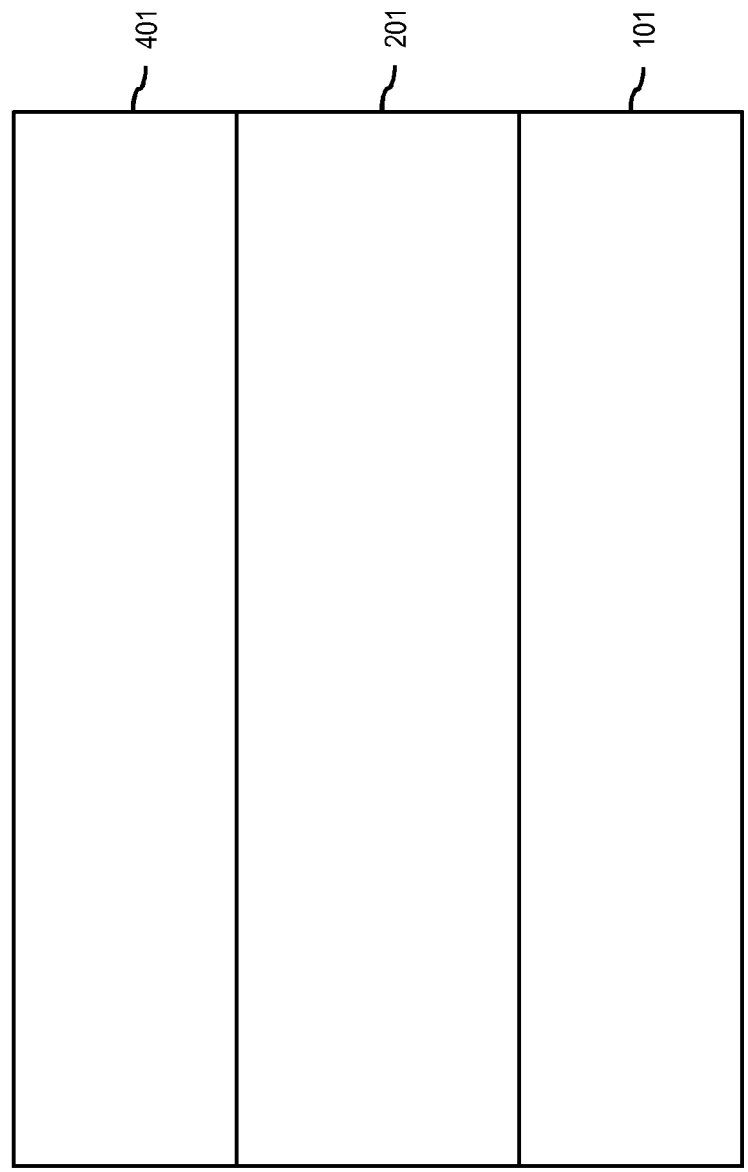
FIGS. 12 through 21 schematically illustrate alternative methods for forming alternative PCRAM structures with low reset currents, in accordance with other exemplary embodiments.

Adverting to FIG. 12, a method of forming a PCRAM with a low reset current, in accordance with another exemplary embodiment, begins with the electrode 101, the first ILD 201 of a first interlayer dielectric material, and the second ILD 401 of a second dielectric interlayer dielectric material, similar to the method of the first embodiment. However, in accordance with the alternative exemplary embodiment the phase-change layer 301 is excluded between the first ILD 201 and the second ILD 401.

Figure 13:
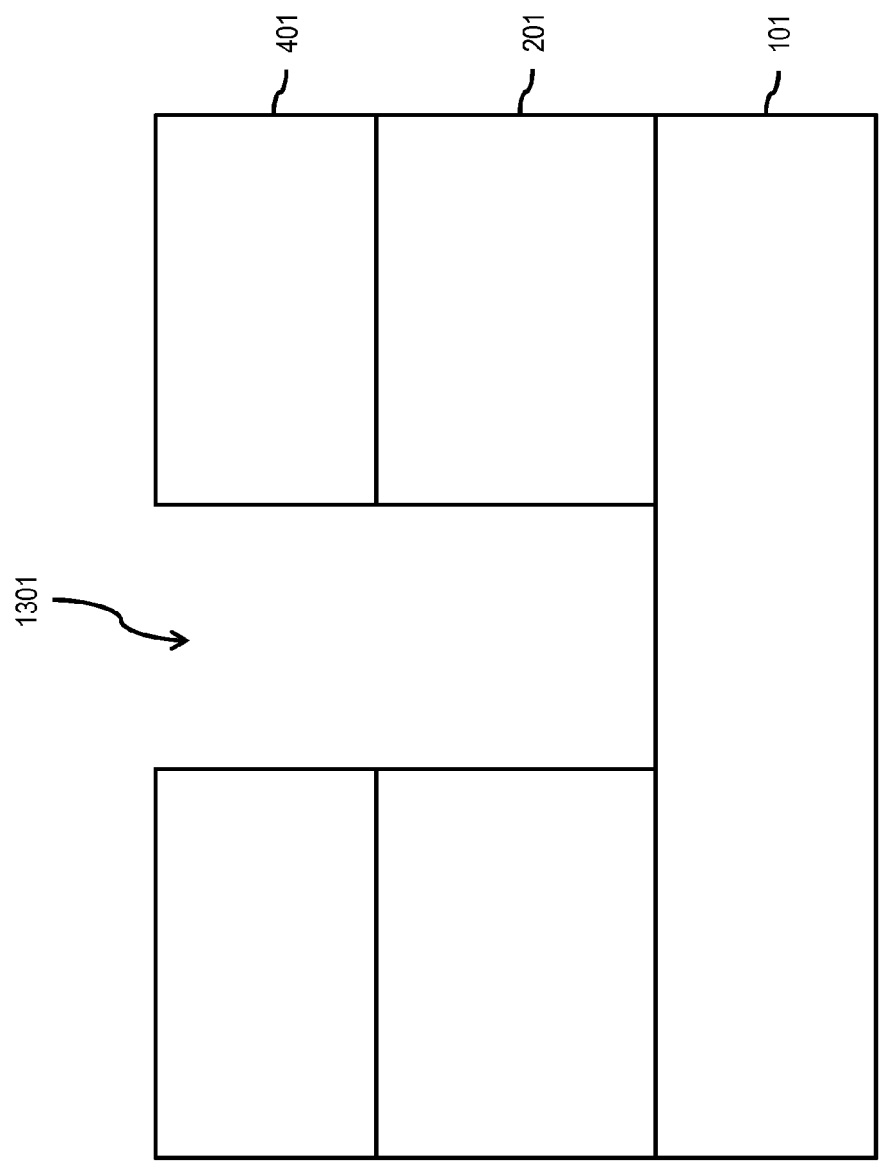

Next, a cell area 1301 may be formed by removing portions of the second ILD 401 and the first ILD 201, as illustrated in FIG. 13. The cell area 1301 may be formed according to any process, such as by a contact-etch process, as discussed above with respect to the cell area 501. The cell area 1301 may be formed to a depth of 100 to 200 nm with a width of 30 to 60 nm.

Figure 14:
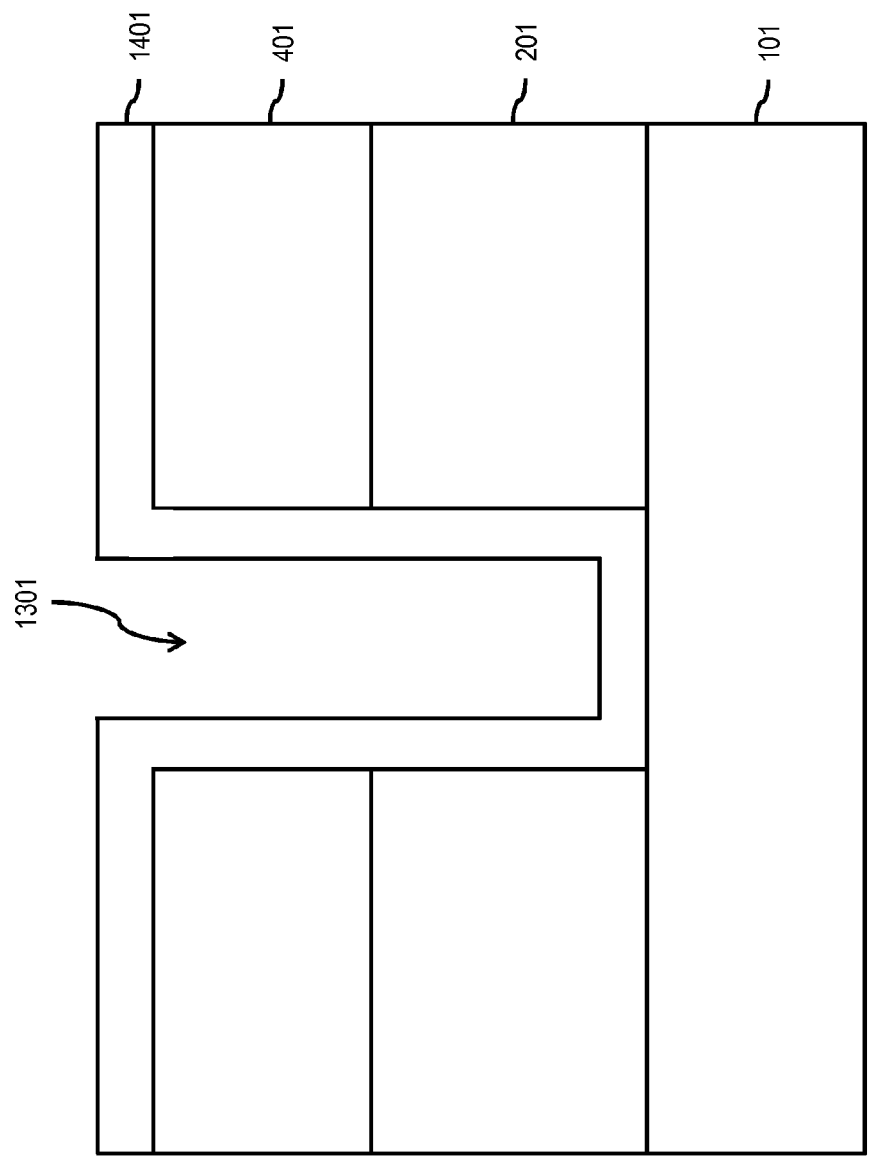

Adverting to FIG. 14, a heater liner 1401 may be conformally deposited over the second ILD 401 and within the cell area 1301. The heater liner 1401 may be formed of W, Ti, or TiN and to a thickness of 10 to 50 Å. However, the thickness of the heater liner 1401 may be thinner than 10 Å.

Figure 15:
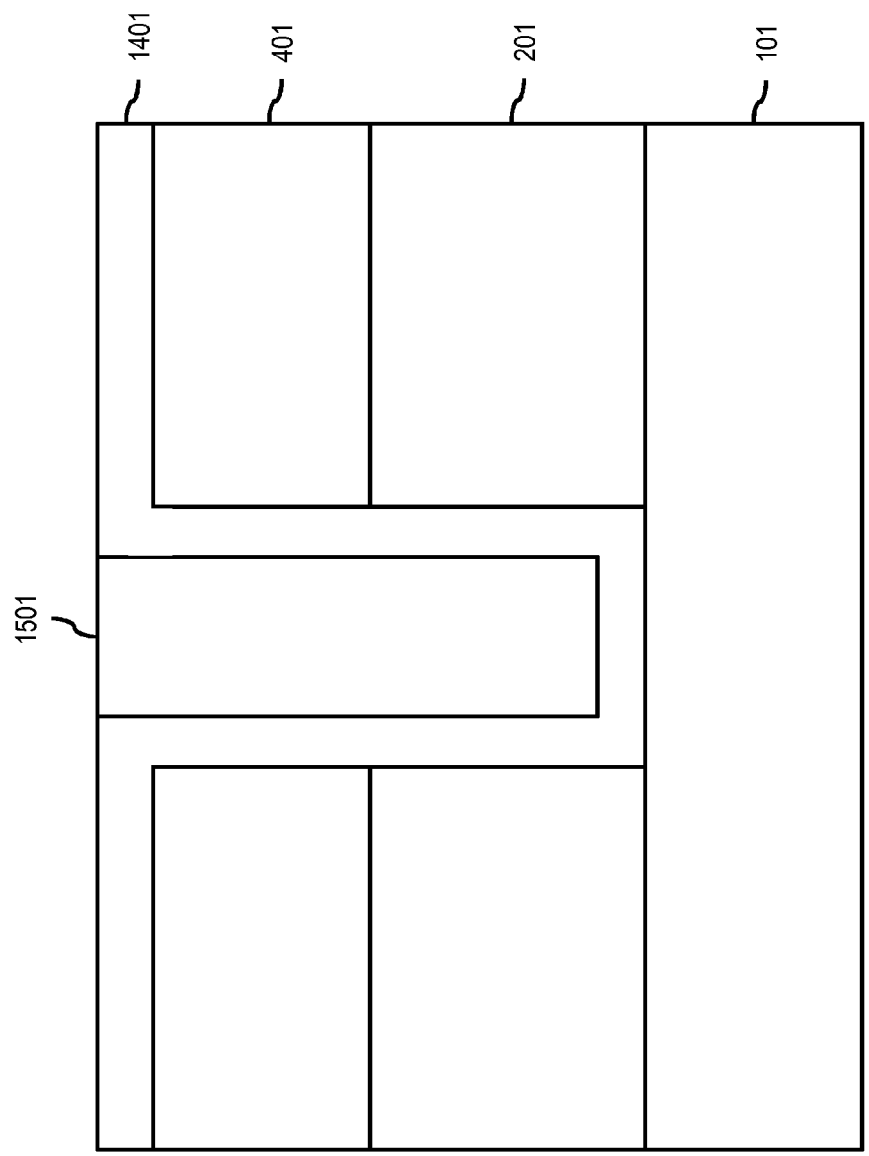

The remaining area of the cell area 1301 may be subsequently filled with an interlayer dielectric material to form an interlayer dielectric structure 1501 (FIG. 15). The interlayer dielectric material used to form the interlayer dielectric structure 1501 may be any interlayer dielectric, such as $SiO_2$, SiON, $Si_3N_4$, or fluorine doped $SiO_2$, as long as the interlayer dielectric material used is different than the material of the second ILD 401.

Figure 16:
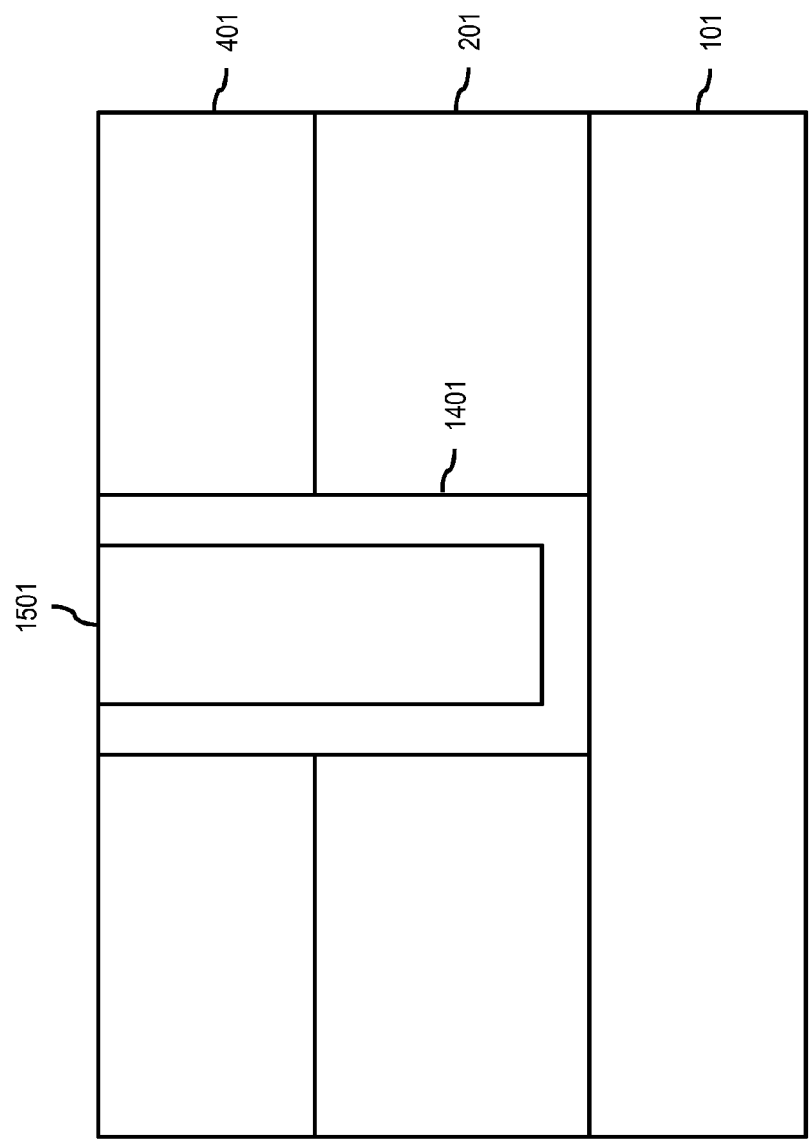

Next, the portions of the heater liner 1401 and the interlayer dielectric structure 1501 above the top surface of the second ILD 401 may be removed, as illustrated in FIG. 16. The portions of the heater liner 1401 and the interlayer dielectric structure 1501 may be removed according to any known process, such as CMP down to second ILD 401.

Figure 17:
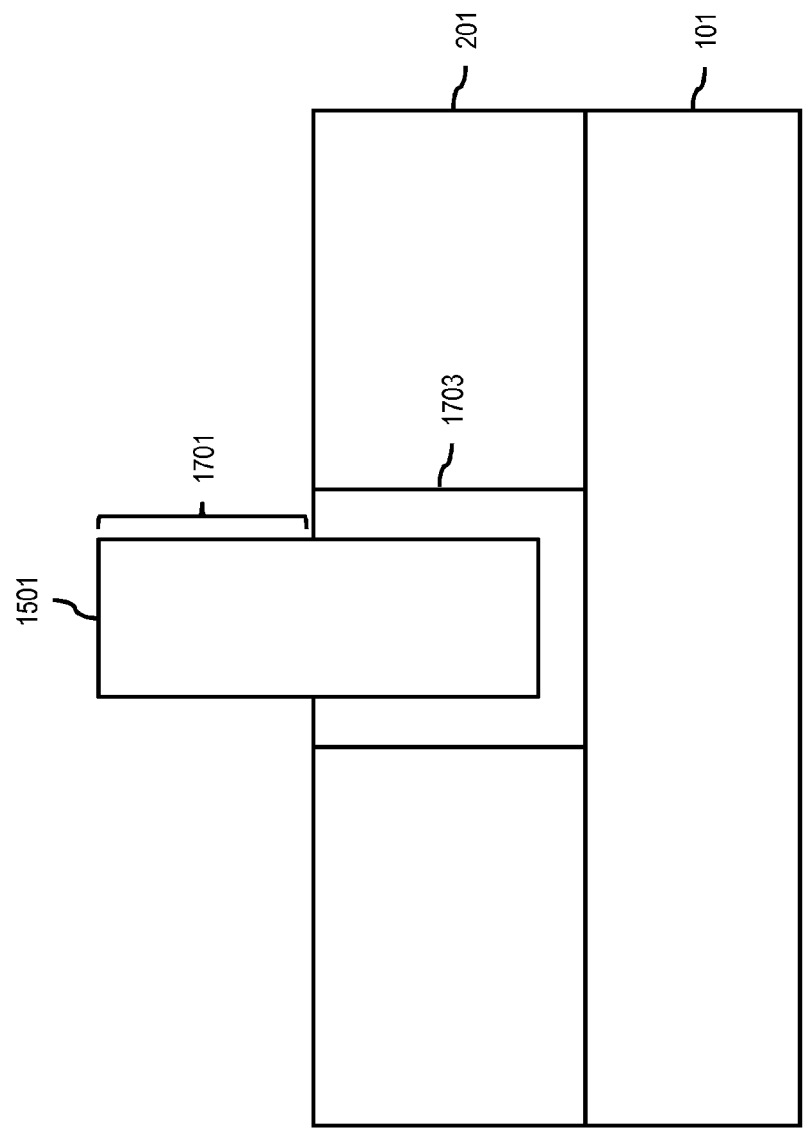

After the second ILD 401 is exposed, it may be removed according to any process that is selective to the interlayer dielectric material of the interlayer dielectric structure 1501, such as a blanket etch process. Additionally, a portion of the heater liner 1401 that is above the top surface of the first ILD 201 may be removed, exposing a protruding portion 1701 of the interlayer dielectric structure 1501, as illustrated in FIG. 17. The portion of the heater liner 1401 may be removed by the same etch process used to remove the second ILD 401 or by another etch process. The remaining portion of the heater liner 1401 forms a u-shaped heater liner 1703. As illustrated in FIG. 17, the top surface of the vertical portions of the u-shaped heater liner 1703 may be coplanar with the top surface of the first ILD 201.

Figure 18:
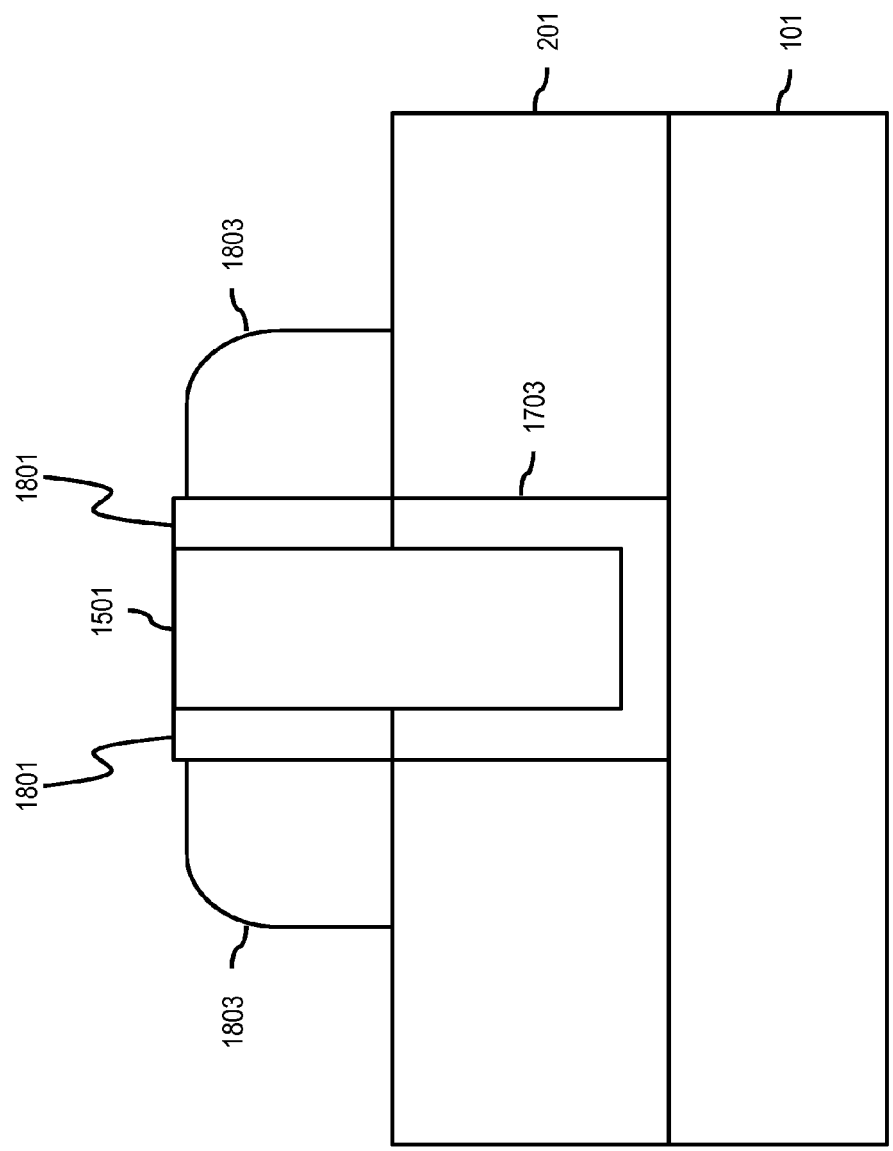

Adverting to FIG. 18, a phase-change layer 1801 may be formed surrounding the interlayer dielectric structure 1501. The phase-change layer 1801 may be formed by any process, such as by conformally forming phase-change material over the first ILD 201 and the interlayer dielectric structure 701 and subsequently removing the horizontal portions of the phase-change layer 1801 above both the first ILD 201 and the interlayer dielectric structure 701, thereby forming the phase-change layer 1801 in the shape of thin spacers. A top surface of the phase-change layer 1801 may be coplanar with a top surface of the interlayer dielectric structure 1501. The phase-change layer 1801 may be formed of any type of phase-change material, such as GST or AIST and may be formed to a thickness of 10 to 50 Å. Alternatively, the thickness of the phase-change layer 1801 may be thinner than 10 Å. Subsequently, a dielectric spacer 1803, such as of $SiO_2$, SiON, or $Si_3N_4$, may be formed surrounding the phase-change layer 1801 around the protruding portion 1701 of the interlayer dielectric structure 1501. The dielectric spacer 1803 may be formed to a shorter height than the phase-change layer 1801 and the interlayer dielectric structure 1501, as illustrated in FIGS. 18 and 19, to expose the phase-change layer 1801.

Figure 19:
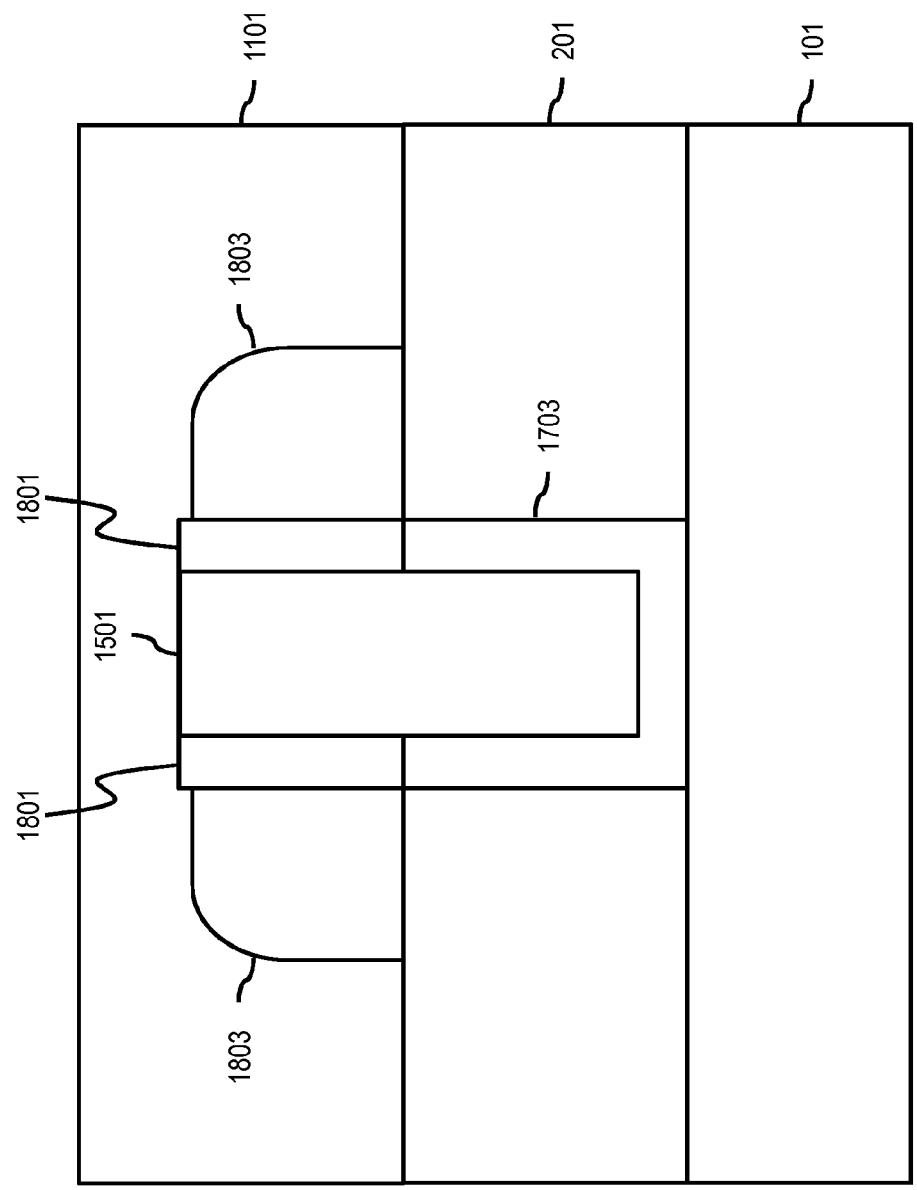

Next, an electrode 1101 may be formed over the entire structure, including the first ILD 201, the dielectric spacer 1803, and the interlayer dielectric structure 1501, as illustrated in FIG. 19. The electrode 1101 may be formed of Al, Pt, TiN, TiN/Ti, Ru, Ni, or polysilicon.

Figure 20:
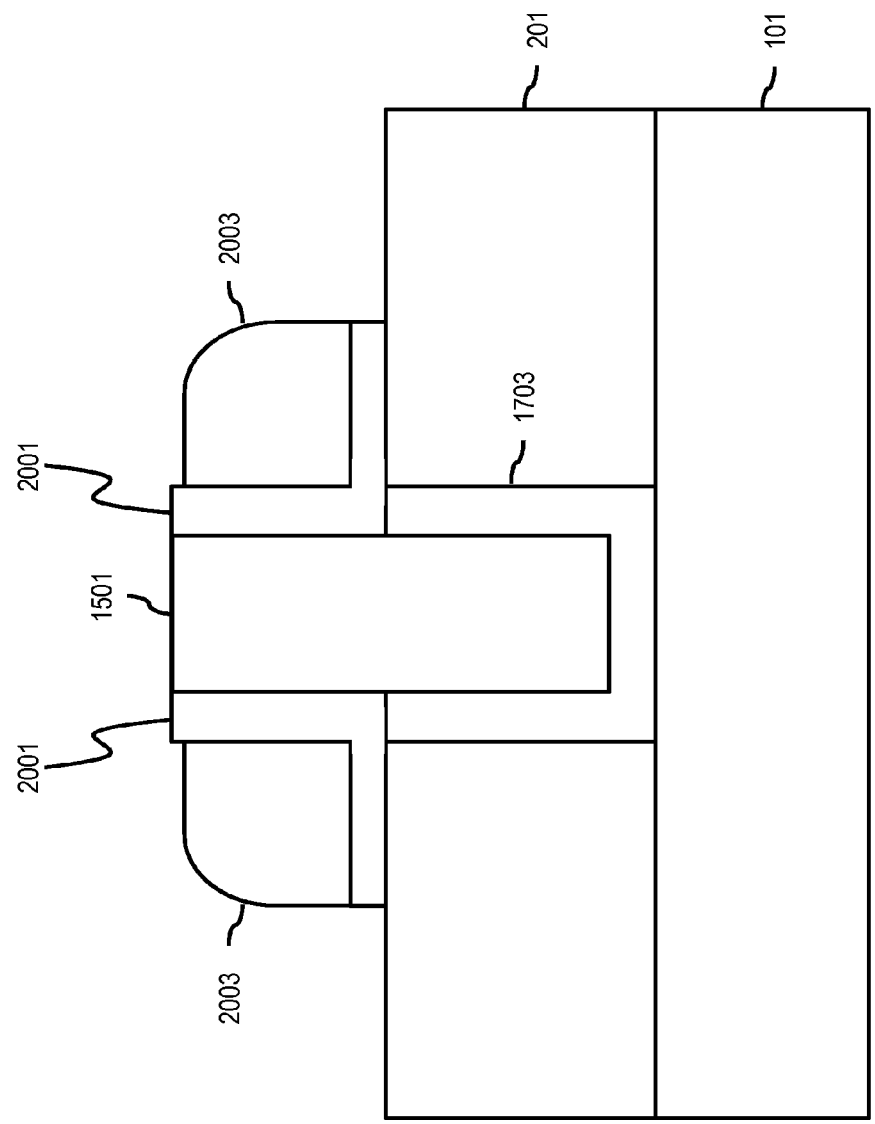

Alternatively, FIG. 20 illustrates a method of forming a PCRAM with a low reset current, in accordance with another exemplary embodiment. After removing the second ILD 401 and the portion of the heater liner 1401 that is above the top surface of the first ILD 201, exposing a protruding portion 1701 of the interlayer dielectric structure 1501, as discussed above with respect to FIG. 17, a phase-change layer 2001 may be formed surrounding the interlayer dielectric structure 1501. The phase-change layer 2001 may be formed by conformally depositing the phase-change layer 2001 over the first ILD 201 and the interlayer dielectric structure 1501. The phase-change layer 2001 may be formed of any type of phase-change material, such as GST or AIST and may be formed to a thickness of 10 to 50 Å. Alternatively, the thickness of the phase-change layer 2001 may be thinner than 10 Å.

Figure 21:
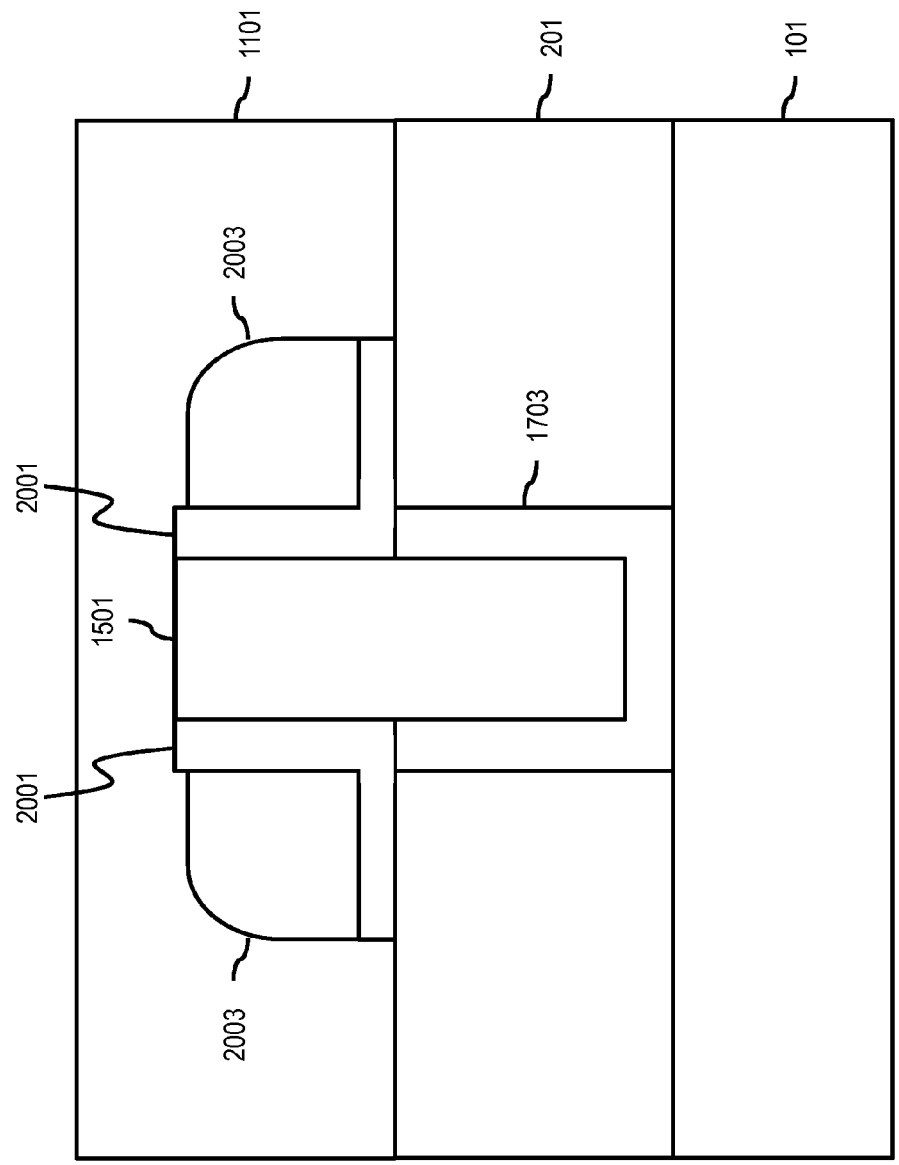

Subsequently, a dielectric spacer 2003 may be formed on and surrounding the phase-change layer 2001 around the protruding portion 1701 of the interlayer dielectric structure 1501. The dielectric spacer 2003 may be formed of a dielectric material, such as $SiO_2$, SiON, or $Si_3N_4$. Upon formation of the dielectric spacer 2003, the portions of the phase-change layer 2001 that are not covered by the dielectric spacer 2003 may be removed, such as above the protruding portion 1701 of the interlayer dielectric structure 1501 and on either edge of the dielectric spacer 2003 above the first ILD 201. As discussed above, the dielectric spacer 2003 may be formed to a lesser height than the phase-change layer 2001 and the interlayer dielectric structure 1501, as illustrated in FIGS. 20 and 21, to expose the phase-change layer 2001. Alternatively, the top surfaces of the dielectric spacer 2003, the phase-change layer 2001, and the interlayer dielectric structure 1501 may be coplanar (not shown for illustrative convenience).

Next, an electrode 1101 may be formed over the entire structure, including the first ILD 201, the dielectric spacer 2003, and the interlayer dielectric structure 1501, as illustrated in FIG. 21. The electrode 1101 may be formed of Al, Pt, TiN, TiN/Ti, Ru, Ni, or polysilicon.

In alternative embodiments, the locations of the phase-change layers and the heater liner may be switched. Thus, in FIG. 21, feature 1703 may be the phase-change layer and feature 2001 may be the heater liner. In FIG. 19, feature 1703 may be the phase-change layer and feature 1801 may be the heater liner. Further, in FIG. 11, feature 903 may be the phase-change layer and feature 1003 may be the heater liner.

The embodiments of the present disclosure achieve several technical effects, including PCRAM structures with higher heating capacities at lower reset currents. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a bottom electrode;
   a u-shaped heater liner;
   an interlayer dielectric (ILD) on the bottom electrode, surrounding the u-shaped heater liner;
   an interlayer dielectric structure surrounded by the u-shaped heater liner and including a protrusion extending above the u-shaped heater liner and a top surface of the ILD;
   a phase-change layer on the ILD, surrounding the interlayer dielectric structure;
   a dielectric spacer above the ILD and surrounding the protrusion; and
   a top electrode covering the ILD, the protrusion, and the dielectric spacer.

2. A device according to claim 1, comprising the dielectric spacer being on the phase-change layer.

3. A device according to claim 1, comprising:
   a top surface of the phase-change layer being level with a top surface of an exposed portion of the u-shaped heater liner above the ILD; and
   the phase-change layer surrounding the exposed portion of the u-shaped heater liner.

4. A device according to claim 1, further comprising the phase-change layer on side surfaces of the protrusion between the dielectric spacer and the protrusion.

5. A device according to claim 4, comprising the phase-change layer on the side surfaces of the protrusion being contiguous and aligned with vertical portions of the u-shaped heater liner.

6. A device according to claim 4, wherein a height of the phase-change layer on the side surfaces of the protrusion and a height of the protrusion are substantially the same.

7. A device according to claim 6, comprising the top surface of the phase-change layer on the side surfaces of the protrusion extending above a top surface of the dielectric spacer.

8. A device according to claim 1, wherein a thickness of a heater liner layer forming the u-shaped heater liner is the same as a thickness of the phase-change layer.

9. A device comprising:
   a bottom electrode;
   a u-shaped heater liner;
   an interlayer dielectric (ILD) on the bottom electrode, surrounding the u-shaped heater liner;
   an interlayer dielectric structure surrounded by the u-shaped heater liner and including a protrusion extending above the u-shaped heater liner and a top surface of the ILD;
   a phase-change layer on side surfaces of the protrusion;
   a dielectric spacer above the ILD and surrounding the protrusion; and
   a top electrode covering the ILD, the protrusion, and the dielectric spacer.

10. A device according to claim 9, comprising the phase-change layer being contiguous and aligned with vertical portions of the u-shaped heater liner.

11. A device according to claim 9, wherein a height of the phase-change layer and a height of the protrusion are substantially the same.

12. A device according to claim 9, comprising the top surface of the phase-change layer extending above a top surface of the dielectric spacer.

13. A device according to claim 9, wherein a thickness of a heater liner layer forming the u-shaped heater liner is the same as a thickness of the phase-change layer.

14. A device comprising:
   a bottom electrode;
   a u-shaped heater liner;
   an interlayer dielectric (ILD) on the bottom electrode, surrounding the u-shaped heater liner;
   an interlayer dielectric structure surrounded by the u-shaped heater liner and including a protrusion extending above the u-shaped heater liner and a top surface of the ILD;
   a phase-change layer, formed to substantially the same thickness as the u-shaped heater liner, the phase-change layer being on the ILD surrounding the interlayer dielectric structure and level with a top surface of an exposed portion of the u-shaped heater liner and/or the phase-change layer being on side surfaces of the protrusion to the same height as the protrusion;
   a dielectric spacer above the ILD and surrounding the protrusion; and
   a top electrode covering the ILD, the protrusion, and the dielectric spacer.

15. A device according to claim 14, wherein the phase-change layer is on side surfaces of the protrusion, contiguous and aligned with vertical portions of the u-shaped heater liner.

16. A device according to claim 15, wherein a top surface of the phase-change layer extends above a top surface of the dielectric spacer.

17. A device according to claim 14, wherein the phase-change layer comprises $Ge_2Sb_2Te_5$ (GST) or silver and indium doped $Sb_2Te$ (AIST) and is formed to a thickness of 10 to 50 angstroms (Å).

18. A device according to claim 14, wherein the heater liner comprises tungsten (W), titanium (Ti), or titanium nitride (TiN) and is formed to a thickness of 10 to 50 Å.

19. A device according to claim 14, wherein the interlayer dielectric structure comprises silicon dioxide ($SiO_2$), silicon oxynitride (SiON), silicon nitride ($Si_3N_4$), or fluorine doped $SiO_2$.

20. A device according to claim 14, wherein the bottom and top electrodes comprise aluminum (Al), platinum (Pt), titanium nitride (TiN), titanium nitride and titanium (TiN/Ti), ruthenium (Ru), nickel (Ni), or polysilicon.

\* \* \* \* \*